United States Patent [19]

Tsuruta

[11] Patent Number: 5,336,633
[45] Date of Patent: Aug. 9, 1994

[54] METHOD OF GROWING SINGLE CRYSTAL SILICON ON INSULATOR

[75] Inventor: Masataka Tsuruta, Kyoto, Japan
[73] Assignee: Rohm Co., Ltd., Kyoto, Japan
[21] Appl. No.: 965,783
[22] Filed: Oct. 23, 1992
[30] Foreign Application Priority Data Oct. 25, 1991 [JP] Japan .................................. 3-279074

[51] Int. Cl.$^5$ ............................................. H01L 21/20
[52] U.S. Cl. ......................................... 437/62; 437/83; 437/84; 437/89
[58] Field of Search ..................... 437/89, 61, 62, 105, 437/84, 83; 168/DIG. 150

[56] References Cited

U.S. PATENT DOCUMENTS 4,561,932 12/1985 Gris et al. ............... 437/83
4,760,036 7/1986 Schubert .................. 437/83

OTHER PUBLICATIONS

Digh Hisamoto et al., "A Fully Depleted Lean—channel Transistor(DELTA)–A novel vertical ultra thin SOI MOSFET—", IEDM 89, pp. 833–836.

Primary Examiner—R. Bruce Breneman
Assistant Examiner—Ramamohan Rao Paladugu
Attorney, Agent, or Firm—Wenderoth, Lnid & Ponack

[57] ABSTRACT

A method for creating a silicon epitaxial layer of excellent crystalline structure includes the step of first etching a silicon substrate masked with oxide and nitride films to leave portions under the mask as seed crystals from which the epitaxial layer is grown. the seed crystals are covered with a nitride layer and the surface of the substrate is oxidized to form an oxide layer insulating the seed crystals from the remainder of the substrate. The nitride is removed but the oxide film is left on top of the seed crystals. Thus, when the seed crystals are epitaxially grown, the oxide film prevents growth in the longitudinal direction. The resulting epitaxial layer has a crystal orientation which corresponds to that of the portion of the substrate from which the epitaxial layer is insulated.

2 Claims, 2 Drawing Sheets

METHOD OF GROWING SINGLE CRYSTAL SILICON ON INSULATOR

BACKGROUND OF THE INVENTION

The present invention generally relates to a silicon crystal growing method for forming a Si crystal layer in the same crystal direction through an insulation layer on a Si base plate suitable for a high speed element, a three-dimensional IC or the like.

In a conventional silicon crystal growing method, a silicon epitaxial layer is formed at the gaps of a $SiO_2$ layer, provided on the Si base plate, with the use of a gaseous phase growing method. In such a conventional method, the epitaxial layer and the Si base plate could not be insulated, the properties of the crystal on the side face of the $SiO_2$ layer were poor, and the epitaxial layer could not be prevented from growing in the longitudinal direction.

SUMMARY OF THE INVENTION

Accordingly, the present invention has been developed with a view to substantially eliminate the above-discussed drawbacks inherent in the prior art and has as its essential object to provide an improved silicon crystal growing method.

Another important object of the present invention is to provide an improved silicon crystal growing method comprising the steps of covering the silicon base plate with an insulating film, and forming an epitaxial layer with the same crystal orientation as in the silicon base plate while the silicon base plate and the epitaxial layer are insulated.

In accomplishing these and other objects, a method of growing silicon crystals on the insulating film in accordance with the present invention comprises the steps of using a mask of a silicon oxide film and a silicon nitride film on a Si base plate when etching the Si base to make Si seed crystals, removing a nitride film from the Si base plate surface while leaving a nitride film on the entire side face of each of the seed crystals and the surface of the mask by using an anisotropic etching process, injecting oxygen onto the surface of the Si base plate so as to form an oxide insulating layer which separates the seed crystals from the Si base plate at the upper portion of the Si base plate, removing the nitride film from the side face of the seed crystals while leaving the oxide film on the surface of the seed crystals, and thereafter epitaxially growing the seed crystals from the side surfaces thereof in a lateral direction so as to form on top of the insulating layer a series of single crystal layers mutually combined in the same crystal direction as the crystal orientation of the Si base plate.

Even more specifically, the method of growing silicon crystals on the insulating film on the silicon base plate comprises the steps of forming an oxide film / a nitride film on the silicon base plate, etching the base plate with the oxide film / the nitride film as the mask, whereby portions of the silicon base plate beneath the mask remain as seed crystals, forming a protective nitride film by gaseous phase growth on the side surfaces of the seed crystals, thereafter effecting an anisotropic etching operation to form a field oxide film insulating the seed crystals from the remainder of the silicon base plate, and epitaxially growing the crystals while preventing epitaxial growth in the longitudinal direction by first removing all nitride films but leaving the oxide film of the mask on the seed crystals during the growing operation.

According to the invention, the height of the seed crystal corresponds to the depth to which the silicon base plate is etched so that the thickness of the epitaxial layer may be controlled. The seed crystals are oriented in the same direction as the silicon base plate, and the seed crystals are protected by the nitride film, when the field oxide film (insulating film) is formed. Better growth can be obtained by removing the nitride film from the side surfaces of the crystals and washing the side surfaces. Epitaxial growth in the longitudinal direction is prevented by the oxide film of the mask.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1A:
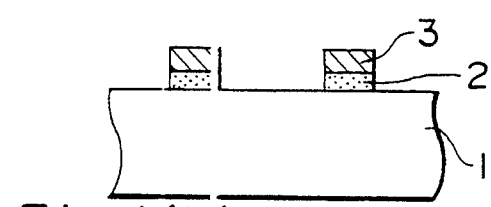
FIGS. 1(a)–1(g) are sectional views of a silicon base plate, and each showing a step of a crystal growing method according to the present invention.

Before the description of the present invention proceeds, it is to be noted that like parts are designated by like reference numerals throughout the accompanying drawings.

The present invention will be described hereinafter with reference to embodiments shown in the drawings.

Figure 1B:
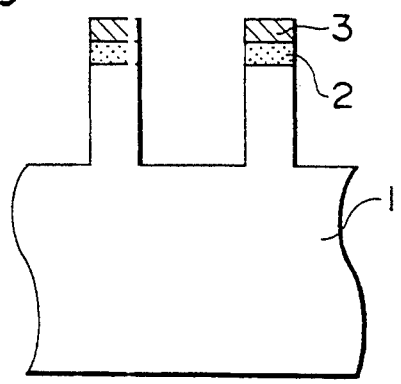
Figure 1C:
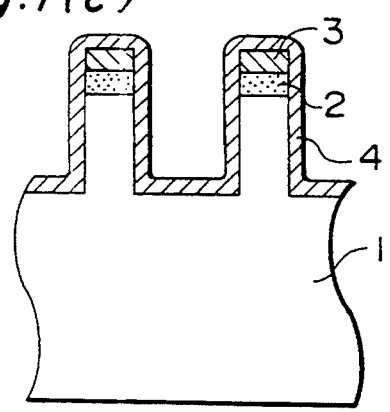
Figure 1D:
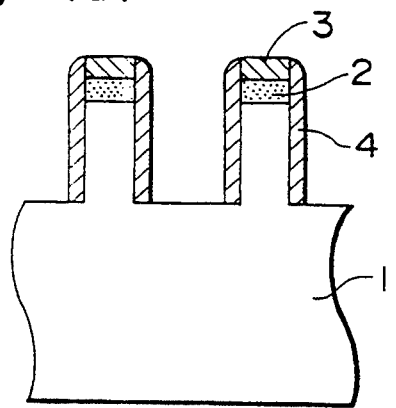
Figure 1E:
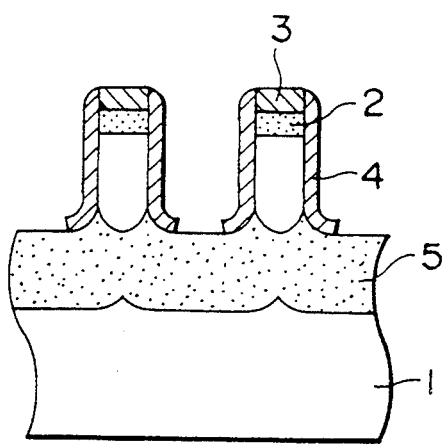
Figure 1F:
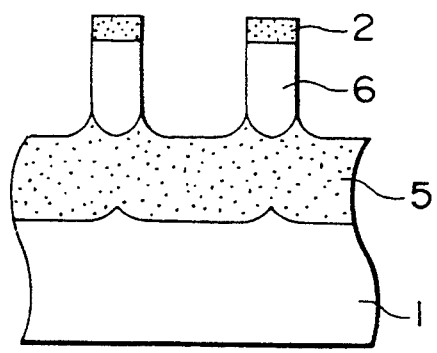
Figure 1G:
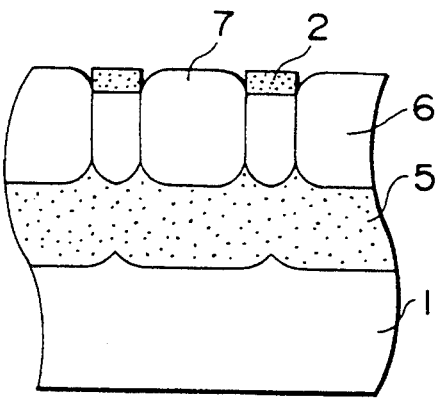

FIGS. 1(a)–1(g) show steps of forming an insulating layer on a Si base plate and growing a silicon crystal on the insulating layer. An oxide film 2 and a nitride film 3 which become a mask with the use of a resist are formed on a silicon base plate as shown in FIG. 1(a). The silicon base plate (substrate) is subjected to anisotropic etching as shown in FIG. 1(b) so as to form a silicon seed crystal under the mask. Thereafter, by using a gaseous growing technique, a silicon nitride film accumulates on the entire surface of the mask, the side face of the seed crystal and the surface of the silicon base plate. (FIG. 1(c)) The surface of the silicon base plate is stripped (FIG. 1(d)) with the nitride film accumulated during the former step being left on the side walls of the mask and the seed crystal. Oxidation is effected as shown in FIG. 1(e) so that a field oxide film 5 is formed on the top of the silicon base plate so as to separate from the silicon base plate portions beneath the mask which are to serve as seed crystals. As shown in FIG. 1(f), the nitride film is removed with the use of phosphoric acid or the like so as to expose the side wall of the seed crystal, whereby the side wall of the seed crystal can be cleaned using wet etching or the like. As shown in FIG. 1(g), the oxide film prevents the longitudinal growth of the seed crystal. Epitaxial growth in the lateral direction is effected so as to form a series of single crystal layers mutually combined on the top of the above-described insulation layer.

Figure 2A:
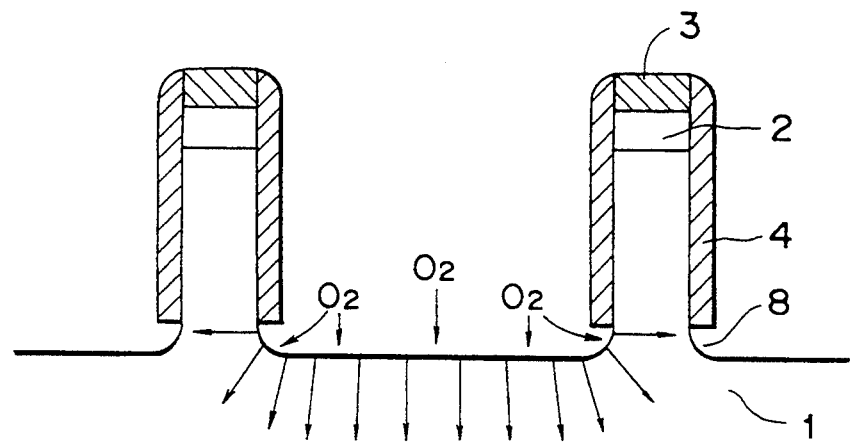
FIGS. 2(a) and 2(b) are sectional views of a silicon epitaxial layer, and showing an additional step in the method of FIGS. 1(a)–1(g)
Figure 2B:
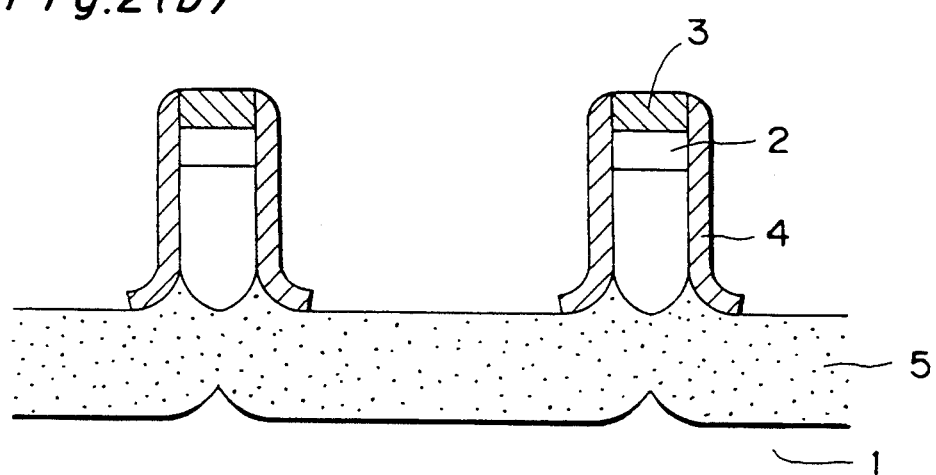
Figure 3:
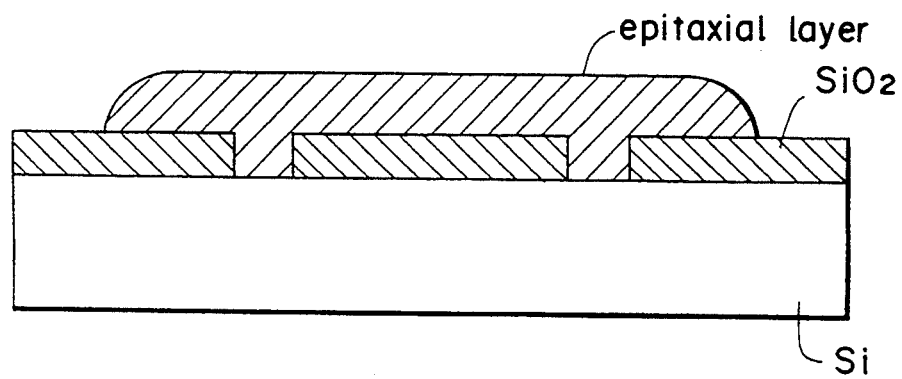
FIG. 3 is a sectional view of a conventional silicon base plate and epitaxial layer.

In addition to the steps described above, the Si which is in contact with the lower end of the nitride film of the base end portion of the seed crystal can be removed by a wet isotropic etching of the Si as shown in FIG. 2(a) after the step shown in FIG. 1(d). By using such a step, the oxygen is more likely to penetrate the base end portion of the seed crystal from which the nitride layer has been removed so that the field oxide layer is in a good condition even downwards of the seed crystal as shown in FIG. 2(b).

As is clear from the foregoing description, according to the method of the present invention, the etching of the silicon basic plate is effected with the silicon oxide film / silicon nitride film being used as a mask, and the silicon under the mask is used as a seed crystal to be epitaxially grown. The thickness of the epitaxial layer is thus dependent on the etching depth because the silicon under the mask is used as the seed crystal. The nitride film is formed so that the seed crystal can be insulated from the remainder of the base plate with the use of a field oxide film. The oxide film used as the mask is left so as to prevent the longitudinal growth of the seed crystal during the epitaxial growth step. The crystal property of the epitaxial layer is fine because the crystal property of the seed is good. The insulation of the silicon base plate from the epitaxial layer is remarkable. Therefore, the silicon manufactured according to the present invention is suitable for high speed elements, such as three-dimensional ICs.

Although the present invention has been fully described by way of example with reference to the accompanying drawings, it is to be noted here that various changes and modifications will be apparent to those skilled in the art. Therefore, unless such changes and modifications otherwise depart from the scope of the present invention, they should be construed as included therein.

What is claimed is:

1. A method of growing crystal silicon on a substrate, said method comprising the steps of:
    etching a Si substrate masked with a silicon oxide film and a silicon nitride film to form Si seed crystals on which the mask is left,
    forming a nitride film over the mask, an entire side surface of each of the Si seed crystals, and an exposed surface of the Si substrate;
    removing the nitride film from the surface of the Si substrate while leaving the nitride film on the entire side surface of each of the seed crystals and on the mask by subjecting the nitride film to an anisotropic etching process,
    oxidizing the surface of the Si substrate to form an oxide layer which insulates the seed crystals from the Si substrate at an upper portion of the Si substrate,
    subsequently removing the nitride film from the side surface of each of the seed crystals while leaving the oxide film of the mask on the seed crystals, and
    thereafter epitaxially growing the seed crystals from the side surfaces thereof in a lateral direction of the seed crystals to form on the upper portion of the oxide layer a series of single crystal layers mutually combined in the same crystal orientation as the Si substrate.

2. A method of growing crystal silicon on a substrate as claimed in claim 1, and further comprising etching the exposed surface of the Si substrate after said step of removing the nitride film from the surface of the Si substrate and before the step of oxidizing the surface of the Si substrate until a surface portion of the silicon of the substrate directly beneath the nitride film on the side surfaces of the seed crystals is removed, thereby ensuring that oxygen during said step of oxidizing completely penetrates base ends of each of the seed crystals.

* * * * *